United States Patent
Stein

(10) Patent No.: US 12,055,564 B2
(45) Date of Patent: Aug. 6, 2024

(54) OSCILLOSCOPE AND SIGNAL ANALYSIS METHOD

(71) Applicant: Rohde & Schwarz GmbH & Co. KG, Munich (DE)

(72) Inventor: Manuel Stein, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 48 days.

(21) Appl. No.: 17/730,843

(22) Filed: Apr. 27, 2022

(65) Prior Publication Data

US 2022/0397589 A1 Dec. 15, 2022

(30) Foreign Application Priority Data

Jun. 10, 2021 (EP) .................................... 21178835

(51) Int. Cl.
*G01R 13/02* (2006.01)

(52) U.S. Cl.
CPC ..... *G01R 13/0272* (2013.01); *G01R 13/0254* (2013.01); *G01R 13/029* (2013.01)

(58) Field of Classification Search
CPC ............ G01R 13/0272; G01R 13/0254; G01R 13/029; G01R 13/0218; G01R 13/0236; H04B 17/101
USPC .......................................................... 702/67
See application file for complete search history.

(56) References Cited

U.S. PATENT DOCUMENTS

| | | | |
|---|---|---|---|
| 2009/0069057 A1* | 3/2009 | Haartsen | H04W 72/542 455/574 |
| 2012/0039374 A1* | 2/2012 | Dobyns | G01R 13/0236 375/224 |
| 2012/0041701 A1* | 2/2012 | Hillman, Jr. | G01R 23/16 702/66 |
| 2013/0060527 A1 | 3/2013 | Martin | |
| 2013/0090874 A1 | 4/2013 | Bishop | |
| 2013/0216229 A1 | 8/2013 | Cvijetic et al. | |

(Continued)

FOREIGN PATENT DOCUMENTS

KR 100905153 B1 * 6/2009

OTHER PUBLICATIONS

English translation of KR 100905153, 2009. (Year: 2009).*

*Primary Examiner* — Michael P Nghiem
(74) *Attorney, Agent, or Firm* — CHRISTENSEN O'CONNOR JOHNSON KINDNESS PLLC

(57) ABSTRACT

An oscilloscope includes a signal input circuit, a switching matrix circuit, and a downconverter circuit. The signal input circuit is configured to receive M input signals, wherein at least one of the input signals is a signal comprising at least two carriers. The switching matrix circuit is configured to selectively forward at least one input signal from at least one of the switching matrix inputs to the switching matrix outputs. The downconverter circuit includes a local oscillator and at least two downconverter sub-circuits. The at least two downconverter sub-circuits are configured, for example, to: down-convert a first signal component of the signal that is associated with a first one of the least two carriers based on a local oscillator signal and down-convert a second signal component of the signal that is associated with a second one of the least two carriers based on the local oscillator signal, respectively.

16 Claims, 3 Drawing Sheets

(56) References Cited

U.S. PATENT DOCUMENTS

| | | | |
|---|---|---|---|
| 2015/0365877 A1* | 12/2015 | Leather | H04L 49/101 |
| | | | 370/328 |
| 2017/0085349 A1* | 3/2017 | Ho | H04B 1/123 |
| 2018/0360421 A1* | 12/2018 | Rigby | A61B 8/4494 |
| 2018/0372655 A1* | 12/2018 | Dandy | G01R 15/26 |
| 2019/0115930 A1 | 4/2019 | Pupalaikis et al. | |
| 2019/0212369 A1* | 7/2019 | Wagner | G01R 35/005 |
| 2020/0132727 A1 | 4/2020 | Lehane et al. | |

* cited by examiner

OSCILLOSCOPE AND SIGNAL ANALYSIS METHOD

FIELD OF THE DISCLOSURE

Embodiments of the present disclosure generally relate to an oscilloscope. Embodiments of the present disclosure further relate to a signal analysis method of analyzing an input signal by an oscilloscope.

BACKGROUND

Traditionally, signal analyzers are used for performing different types of RF measurements on RF signals that are transmitted wirelessly, for example wireless transmitter (Tx) measurements.

However, many modern data transmission techniques involve RF signals having a bandwidth that may be considerably larger than a signal analyzer can measure at once. Thus, an oscilloscope may be used instead of the signal analyzer in order to perform the RF measurements, as oscilloscopes inherently can cover a larger bandwidth than signal analyzers.

One particular challenge is the analysis of RF signals having several carriers. Typically, the RF signal is processed by the oscilloscope and saved in an acquisition memory. Afterwards, the acquired data is post-processed in order to extract information regarding the different carriers.

However, in certain applications, a real-time analysis of RF signal having several carriers is desirable.

Thus, there is a need for an oscilloscope that is capable of a real-time analysis of input signals having several carriers.

SUMMARY

Embodiments of the present disclosure relate to an oscilloscope. In an embodiment, the oscilloscope comprises a signal input circuit, a switching matrix circuit, and a downconverter circuit. The signal input circuit is configured to receive M input signals, wherein M is an integer bigger than or equal to 1, and wherein at least one of the input signals is a signal comprising at least two carriers. The switching matrix circuit comprises M switching matrix inputs and K switching matrix outputs, wherein K is an integer bigger than or equal to 2. Each of the M switching matrix inputs is associated with one of the M input signals, respectively. The switching matrix circuit is configured to selectively forward at least one input signal from at least one of the switching matrix inputs to the switching matrix outputs. The downconverter circuit is connected with the switching matrix outputs. The downconverter circuit comprises a local oscillator and at least two downconverter sub-circuits. The local oscillator is configured to generate a local oscillator signal. A first one of the at least two downconverter sub-circuits is configured to down-convert a first signal component of the signal that is associated with a first one of the least two carriers based on the local oscillator signal. A second one of the at least two downconverter sub-circuits is configured to down-convert a second signal component of the signal that is associated with a second one of the least two carriers based on the local oscillator signal.

The term "carrier" is understood to denote both carriers and sub-carriers.

The term "down-convert" is understood to denote a conversion of the respective signal from a higher frequency to a lower frequency based on the local oscillator signal. For example, the respective signal may be mixed with the local oscillator signal and filtered appropriately with a low-pass filter, band-pass filter and/or high-pass filter.

The term "selectively forward" is to be understood as follows. The switching matrix circuit provides an arbitrary routing between the switching matrix inputs and the switching matrix outputs. For example, the switching matrix circuit may forward each input signal to exactly one switching matrix output, respectively. As another example, the switching matrix circuit may forward exactly one input signal to all of the switching matrix outputs.

However, all other conceivable routings are also possible. For example, one or more input signals may be discarded, i.e. not forwarded to any switching matrix output. One or more input signals may be forwarded to exactly one switching matrix output. One or more input signals may be forwarded to two or more switching matrix outputs.

The oscilloscope according to embodiments of the present disclosure is based on the idea to extract the first signal component and the second signal component by the switching matrix, the local oscillator, and the at least two downconverter circuits. In some embodiments, the first signal component and the second signal component are extracted by the switching matrix, the local oscillator, and the at least two down-converter circuits before the acquired data are saved in an acquisition memory or forwarded to a trigger circuit of the oscilloscope. In other words, the first signal component and the second signal component are not extracted in post-processing, but rather in real-time during the acquisition of the input signal(s).

Thus, examples of the oscilloscope disclosed herein are capable of analyzing input signals having two or more carriers in real time, wherein signal components that are associated with the different carriers may be analyzed individually at the same time.

Accordingly, the switching matrix circuit and/or the downconverter circuit may be established purely as hardware circuits, components, etc., such that the processing speed of these components is enhanced considerably compared to software-based implementations.

According to an aspect of the present disclosure, the local oscillator is, for example, a numerically controlled oscillator. Accordingly, the local oscillator may be configured to generate the local oscillator signal such that the local oscillator signal has a predetermined frequency.

The frequency of the local oscillator signal may be adaptable, for example based on the frequencies of the at least two carriers. The frequencies of the at least two carriers may be known, e.g. if the input signals are modulated according to a particular protocol employing predefined carrier frequencies. Alternatively or additionally, the oscilloscope may be configured to estimate the frequencies of the at least two carriers by a Fast Fourier transform of the input signal(s).

In an embodiment of the present disclosure, the signal comprising the at least two carriers is established as a multi-carrier signal. The multi-carrier signal comprises at least two different carriers, for example at least four different carriers, for example at least eight different carriers. However, the multi-carrier signal may, in principle, comprise up to several ten different carriers, up to several hundred different carriers, or even up to several thousand different carriers.

According to another aspect of the present disclosure, the signal comprising the at least two carriers is, for example, an OFDM modulated signal or an FDMA modulated signal. However, it is to be understood that the oscilloscope according to the present disclosure may be used for analyzing arbitrary input signals that comprise at least two carriers.

In an embodiment of the present disclosure, the switching matrix circuit comprises a crossbar switch. In general, the crossbar switch comprises several switches that are arranged in a matrix configuration. By actuating the switches appropriately, an arbitrary routing between the switching matrix inputs and the switching matrix outputs is achievable.

According to a further embodiment of the present disclosure, the switching matrix circuit is configured to forward the signal comprising the at least two carriers to at least two switching matrix outputs, thereby obtaining at least two copies or representatives of the signal, for example wherein the switching matrix circuit is configured to forward the signal comprising the at least two carriers to four switching matrix outputs or to eight switching matrix outputs. In general, the number of copies or representatives of the signal comprising the at least two carriers determines how many signal components associated with the individual carriers can be processed simultaneously.

Thus, if two copies or representatives are obtained, two different signal components corresponding to two different carriers can be processed simultaneously by the at least two down-converter sub-circuits.

If four copies or representatives are obtained, four different signal components corresponding to four different carriers can be processed simultaneously, etc. In this case, the down-converter circuit may comprise at least four down-converter sub-circuits that are configured to down-convert the signal components of the signal that are associated with the four different carriers based on the local oscillator signal.

Therein, the term "copies or representatives" is understood to denote that the signals forwarded to the switching matrix outputs may deviate from the corresponding input signal(s) due to path losses and/or perturbations.

According to an aspect of the present disclosure, the at least two copies or representatives of the signal comprising the at least two carriers are forwarded, for example, to one of the at least two downconverter sub-circuits, respectively. In other words, a first one of the two copies or representatives is forwarded to a first one of the at least two downconverter sub-circuits. A second one of the two copies or representatives is forwarded to a second one of the at least two downconverter sub-circuits. Thus, the at least two copies or representatives can be processed by the downconverter sub-circuits independently and in parallel. Accordingly, information regarding the at least two carriers can be extracted independently and in parallel.

According to another aspect of the present disclosure, the at least two downconverter sub-circuits comprise, for example, a filter, respectively, wherein the respective filter is configured to extract the first signal component or the second signal component. The filters may have an appropriate pass-band such that the first signal component or the second signal component passes the filter, respectively, while other signal components are filtered out.

The pass-bands of the filter may be adaptable, for example based on the frequencies of the at least two carriers. The frequencies of the at least two carriers may be known, e.g. if the input signals are modulated according to a particular protocol employing predefined carrier frequencies. Alternatively or additionally, the oscilloscope may be configured to estimate the frequencies of the at least two carriers, e.g. by a Fast Fourier transform of the input signal(s).

For example, the filter may be established as finite-impulse-response (FIR) filters with programmable filter coefficients and/or as infinite-impulse-response (IIR) filters with programmable filter coefficients.

According to a further aspect of the present disclosure, the at least two downconverter sub-circuits comprise, for example, a decimator circuit, respectively, wherein the respective decimator circuit is configured to down-sample the down-converted first signal component or the down-converted second signal component, respectively. In other words, the decimator circuits are configured to remove a certain portion of sample points associated with the down-converted first signal component or the down-converted second signal component, respectively. This way, the number of samples that have to be processed and/or saved downstream of the decimator circuits is reduced, thus reducing the necessary processing power and/or memory size.

In an embodiment of the present disclosure, the oscilloscope comprises an acquisition memory coupled to the decimator circuits downstream thereof. The down-sampled and down-converted first signal portion and/or the down-sampled and down-converted second signal portion may be saved in the acquisition memory, which is referred to as "saved data" hereinafter. The memory size necessary for the saved data is reduced considerably due to the down-sampling of the first signal component and the second signal component.

The saved data may be post-processed in order to determine additional information with respect to the input signal(s) and/or the carriers.

Alternatively or additionally, the oscilloscope may be configured to generate a graphic representation of the saved data, and the graphic representation may be displayed on a display.

In a further embodiment of the present disclosure, the oscilloscope comprises a trigger circuit, wherein the trigger circuit is connected to the at least two downconverter sub-circuits. Accordingly, the trigger circuit may receive both the down-converted first signal component and the down-converted second signal component. The trigger circuit may be configured to process the down-converted first signal component and the down-converted second signal component independently and/or simultaneously.

For example, the trigger circuit may be configured to apply certain trigger conditions to the down-converted first signal component and the down-converted second signal component independently and/or simultaneously. The trigger conditions applied to the down-converted first signal component and the down-converted second signal component may be the same or may be different from each other.

The trigger circuit may comprise at least one interpolator circuit, wherein the at least one interpolator circuit is configured to up-sample the down-converted first signal component and/or the down-converted second signal component. In other words, the at least one interpolator circuit is configured to enhance the sampling rate associated with the down-converted first signal component or the down-converted second signal component, respectively, e.g. by an interpolation. Thus, the down-converted first signal component and/or the down-converted second signal component are sampled with a higher precision, such that the trigger conditions can be applied with higher precision as well.

In some embodiments, the trigger circuit is configured to detect events associated with the down-converted first signal component and events associated with the down-converted second signal component simultaneously. In other words, the down-converted first signal component and the down-converted second signal component are processed by the trigger circuit in parallel.

According to an aspect of the present disclosure, the down-converted first signal component and the down-converted second signal component are, for example, an IQ signal, respectively. Thus, the downconverter-sub-circuits may be configured to mix the respective input signal with the local oscillator signal, thereby obtaining an I-signal, and to mix the respective input signal with a local oscillator signal that is phase-shifted by 90°, thereby obtaining the Q-signal. The I-signal and the Q-signal together establish the IQ-signal.

In other words, the K output signals of the switching matrix circuit are converted into 2K signals, namely K I-signals and K Q-signals.

In a further embodiment of the present disclosure, the oscilloscope comprises a display, wherein the oscilloscope is configured to display information regarding the first signal component of the signal comprising the at least two carriers and/or information regarding the second signal component of the signal comprising the at least two carriers.

The information displayed may comprise at least one of the following: IQ data associated with the first signal component, IQ data associated with the second signal component, a temporal course of the first signal component, a temporal course of the second signal component, a temporal course of one or several input signals, information regarding trigger conditions met by the first signal component, information regarding trigger conditions not met by the first signal component, information regarding trigger conditions met by the second signal component, and/or information regarding trigger conditions not met by the second signal component.

Embodiments of the present disclosure further provide a signal analysis method for analyzing an input signal by an oscilloscope, for example by any of the oscilloscopes described above. In an embodiment, the signal analysis method comprises the following steps:

receiving at least one input signal, wherein the at least one input signal is a signal comprising at least two carriers;
forwarding the at least one input signal from a switching matrix input to at least two switching matrix outputs;
generating a local oscillator signal by a local oscillator;
down-converting a first signal component of the signal that is associated with a first one of the least two carriers based on the local oscillator signal; and
down-converting a second signal component of the signal that is associated with a second one of the least two carriers based on the local oscillator signal.

In some embodiments, any one of the oscilloscopes described above is configured to perform the signal analysis method according to the present disclosure.

Regarding the further advantages and properties of the signal analysis method, reference is made to the explanations given above with respect to the oscilloscope, which also hold for the signal analysis method and vice versa.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
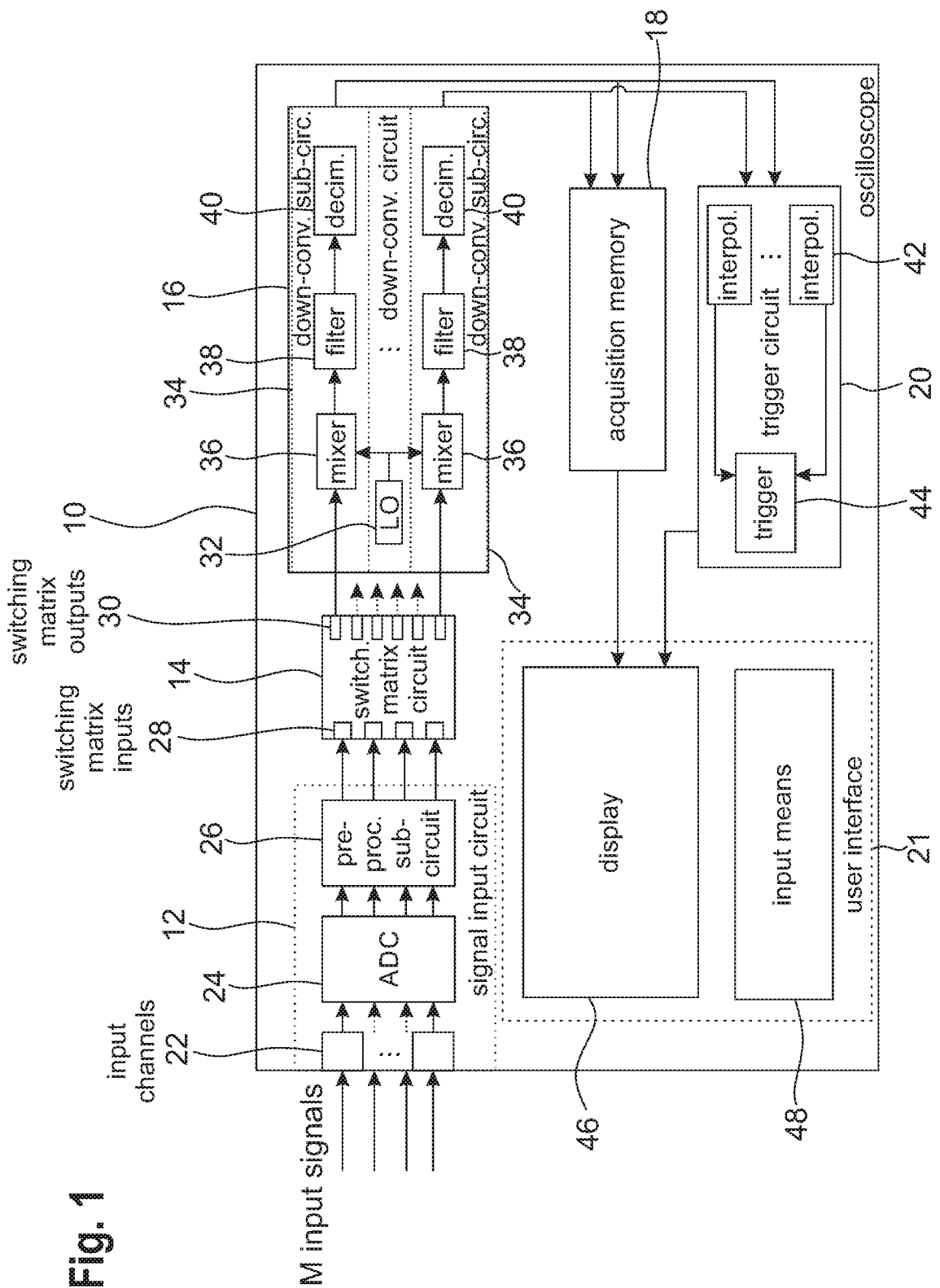
FIG. 1 schematically shows an oscilloscope according to an embodiment of the present disclosure.

FIG. 1 schematically shows an oscilloscope 10. In general, the oscilloscope 10 is a digital oscilloscope. Thus, the oscilloscope 10 is configured to receive and process digital signals, and/or to digitize an analog signal and to process the digitized signal.

As shown in the embodiment of FIG. 1, the oscilloscope 10 comprises a signal input circuit 12, a switching matrix circuit 14, a downconverter circuit 16, an acquisition memory 18, a trigger circuit 20, and a user interface 21.

In some embodiments, the term "circuit," "circuitry," or "unit" as used herein refers to or includes, inter alia, hardware (e.g. a processor such as an integrated circuit, digital circuits or other circuitry), software (e.g. machine- or processor-executable instructions, commands, or code such as firmware, programming, or object code), or a combination of hardware and software that is configured to have a certain functionality. Thus, these circuits may, for example, include hardware only (i.e. a hardware element with no software elements), software hosted at hardware (e.g. software that is stored at a memory and executed or interpreted at a processor), or hardware with the software hosted thereon. In some embodiments, the hardware may, inter alia, comprise a CPU, a GPU, an FPGA, an ASIC, or other types of electronic circuitry.

As shown in the embodiment of FIG. 1, the signal input circuit 12 comprises M input channels 22, wherein M is an integer that is greater than or equal to 1. Accordingly, the signal input circuit 12 is configured to receive M different input signals by the M input channels 22.

The input signals may each be established as an analog input signal or as a digital input signal. The input signals may each comprise up to K different carriers, wherein K is an integer that is greater than or equal to 2. In other words, one or more of the M input signals is/are established as a multi-carrier signal comprising at least two different carriers.

The multi-carrier signal may comprise at least four different carriers, for example at least eight different carriers. However, the multi-carrier signal may, in principle, comprise up to several ten different carriers, up to several hundred different carriers or even up to several thousand different carriers.

In some embodiments, the input signals may be established as RF signals. In this case, the oscilloscope may comprise or may be connected to at least one receiving antenna that is configured to receive the RF signals. For example, at least one of the input signals or all input signals may be an OFDM modulated signal or an FDMA modulated signal, respectively.

The signal input circuit 12 further comprises one or several analog-to-digital converters 24 that is/are configured to digitize the analog input signal(s). Optionally, the signal input circuit 12 may comprise a pre-processing sub-circuit 26. The pre-processing sub-circuit 26 may be configured to pre-process the input signals. For example, the pre-processing sub-circuit 26 may be configured to adapt the levels of the input signals, equalize the input signals, and/or compensate phase shifts or time delays of the input signals.

The switching matrix circuit 14 is connected to the signal input circuit 12 downstream of the signal input circuit 12. In general, the switching matrix circuit 14 comprises M switching matrix inputs 28 and K switching matrix outputs 30. The switching matrix circuit 14 is configured to provide an arbitrary routing between the switching matrix inputs 28 and the switching matrix outputs 30.

For example, the switching matrix circuit 14 may forward each input signal to exactly one switching matrix output 30, respectively. As another example, the switching matrix circuit may forward exactly one input signal to all of the switching matrix outputs 30.

However, all other conceivable routings are also possible. For example, one or more input signals may be discarded, i.e. not forwarded to any switching matrix output 30. One or more input signals may be forwarded to exactly one switching matrix output 30. One or more input signals may be forwarded to two or more switching matrix outputs 30.

For example, the switching matrix circuit 14 comprises a crossbar switch. In general, the crossbar switch comprises several switches that are arranged in a matrix configuration. By actuating the switches appropriately, an arbitrary routing between the switching matrix inputs 28 and the switching matrix outputs 30 is achievable.

As shown in the embodiment of FIG. 1, the downconverter circuit 16 is connected to the switching matrix outputs 30 downstream of the switching matrix circuit 14. The downconverter circuit 16 comprises a local oscillator 32 and several downconverter sub-circuits 34, for example K downconverter sub-circuits 34. The local oscillator 32 may be a numerically controlled oscillator. Accordingly, the local oscillator 32 may be configured to generate a local oscillator signal such that the local oscillator signal has a predetermined frequency. The frequency of the local oscillator signal may be adaptable, for example based on the frequencies of the at least two carriers of the input signals. The local oscillator 32 is connected to each of the downconverter sub-circuits 34.

The frequencies of the at least two carriers may be known, e.g. if the input signals are modulated according to a particular protocol employing predefined carrier frequencies. Alternatively or additionally, the pre-processing sub-circuit 26 may be configured to estimate the frequencies of the at least two carriers by a Fast Fourier transform of the input signal(s).

The downconverter sub-circuits 34 each comprise a mixing unit 36, at least one filter unit 38, and a decimator unit 40. The functionality of these components will be described in more detail below.

The acquisition memory 18 is connected to the decimator units 40 downstream of the downconverter sub-circuits 34. The trigger circuit 20 is connected to the downconverter sub-circuits 34, for example to the decimator units 40, downstream of the downconverter sub-circuits 34.

The trigger circuit 20 comprises at least one interpolator unit 42, for example several interpolator units 42. For example, the trigger circuit 20 comprises K interpolator units 42, wherein each interpolator unit 42 is associated with one of the down-converter sub-circuits 34. Further, the trigger circuit 20 comprises at least one trigger unit 44 downstream of the at least one interpolator unit 42.

As shown in the embodiment of FIG. 1, the user interface 21 comprises a display 46 and inputs 48. Generally, the display 46 is configured to display information regarding the input signals and/or regarding the carriers of the input signals, as will be explained in more detail hereinafter. The inputs 48 are configured to receive user inputs, e.g. via knobs, buttons and/or a touch-sensitive display. In some embodiments, the oscilloscope 10 may be configured to adapt internal settings of the oscilloscope based on the user inputs received.

Figure 2:
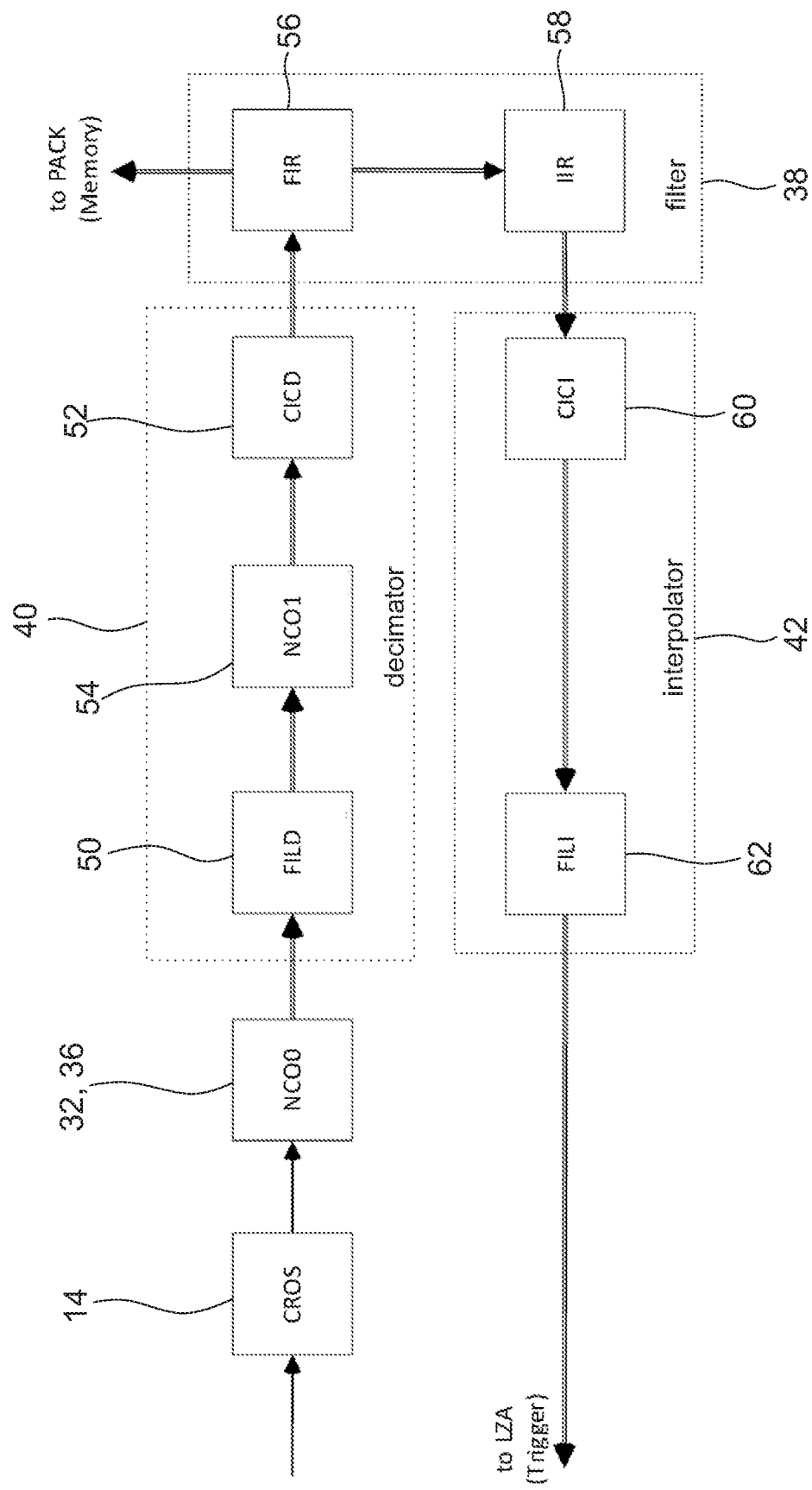
FIG. 2 shows a more detailed view of a portion of the oscilloscope of FIG. 1.

FIG. 2 shows an example embodiment of the components of the oscilloscope 10 downstream of the signal input circuit 12. Compared to FIG. 1, the order of at least one filter unit 38 and the decimator unit 40 is interchanged. It is noted that the order of the filter unit 38 and the decimator unit 40 may be interchanged in FIG. 1 as well.

In this particular example, the decimator units 40 comprise a FIL decimator filter 50, a CIC decimator filter 52, and a second local oscillator 54 interconnected between the decimator filters 50, 52. The CIC decimator filter 52 may be configured to reduce the sample rate of each signal channel by parallelized filter cascade. The CIC decimator filter 52 may be configured to reduce the sample rate of individual channels by a sequential implementation, namely a cascaded-integrator-comb structure. The second local oscillator 54 may be configured to fine-tune the frequency of signals in the respective signal channel.

The at least one filter unit 38 comprises a FIR filter 56 and an IIR filter 58. The at least one interpolator unit comprises a CIC interpolation filter 60 and a FIL interpolation filter 62, which essentially are the up-sampling equivalents of the CIC decimator filter 52 and the FIL decimator filter 50, respectively.

Figure 3:
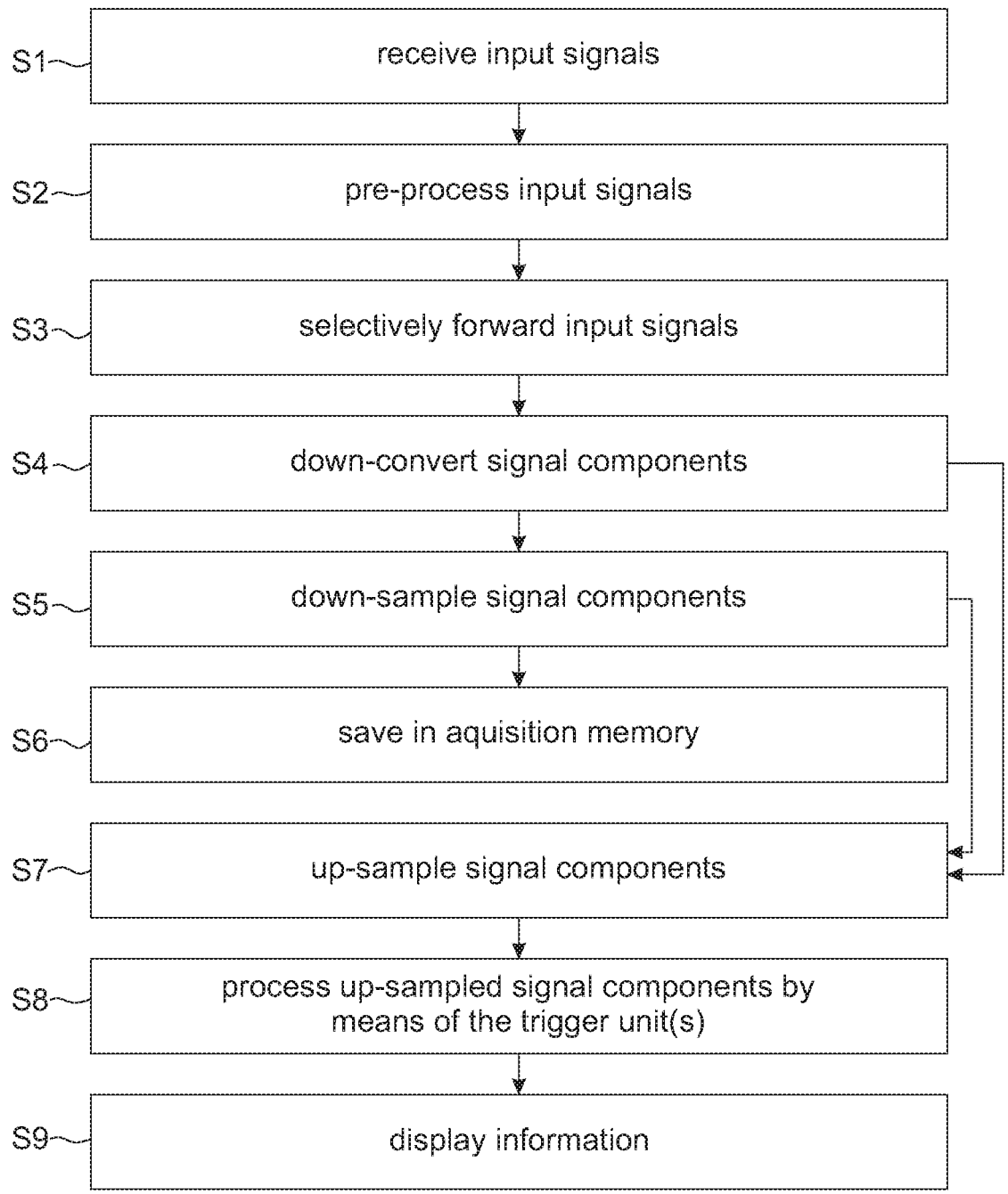
FIG. 3 schematically shows a flow chart of a signal analysis method according to an embodiment of the present disclosure.

The oscilloscope 10 is configured to perform a signal analysis method for analyzing an input signal. An example of the signal analysis method is described in the following with reference to FIG. 3.

M input signals are received by the M input channels 22 (step S1). As already explained above, at least one of the input signals comprises at least two carriers, for example up to K different carriers.

The input signals are pre-processed by the pre-processing sub-circuit 26 (step S2). For example, amplitude levels of the input signals may be adapted, the input signals may be equalized, and/or phase shifts or time delays of the input signals may be compensated.

The pre-processed input signals are forwarded to the switching matrix inputs 28, wherein one input signal is forwarded to one switching matrix input 28, respectively.

The input signals are selectively forwarded from the switching matrix inputs 28 to the switching matrix outputs 30 (step S3). Therein, the at least one input signal that comprises up to K carriers is forwarded to a number of switching matrix outputs 30 matching the number of carriers, thereby obtaining at least two copies or representatives of the multi-carrier signal.

For example, if the at least one input signal comprises two different carriers, the input signal is forwarded to two switching matrix outputs 30. If the at least one input signal comprises four different carriers, the input signal is forwarded to four switching matrix outputs 30, etc. If the at least one input signal comprises K different carriers, the respective input signal is forwarded to all of the K matrix outputs 30.

The copies or representatives of the multi-carrier signal are forwarded to the down-converter sub-circuits 34. In some embodiments, each copy or representative is forwarded to exactly one of the down-converter sub-circuits 34, such that each down-converter sub-circuit 34 receives one copy or representative of the at least one multi-carrier signal.

Signal components associated with the different carriers are down-converted separately by the downconverter sub-circuits 34 (step S4). In some embodiments, the mixing units 36 respectively mix the respective input signal with the local oscillator signal, thereby obtaining an I-signal, and mix the respective input signal with a local oscillator signal that is phase-shifted by 90°, thereby obtaining a Q-signal.

The I-signal and the Q-signal together establish an IQ-signal. In other words, IQ data is generated by the mixing units 36 for each copy or representative of the at least one multi-carrier signal.

For example, if the at least one multi-carrier signal comprises K different carriers, then K I-signals and K Q-signals are generated by the downconverter circuit 16, i.e. 2K signals in total.

The copies or representatives may then be filtered appropriately by the filter units 38 in order to extract the respective signal component of the at least one multi-carrier signal associated with the respective carrier. The filter units 38 may have an appropriate pass-band such that the respectively desired signal component passes the respective filter unit 38, while other signal components are filtered out. Thus, the signal components associated with the at least two carriers are down-converted independently of each other and in parallel by the down-converter sub-circuits 34.

The pass-bands of the filter units 38 may be adaptable, for example based on the frequencies of the at least two carriers. The frequencies of the at least two carriers may be known, e.g. if the input signals are modulated according to a particular protocol employing predefined carrier frequencies.

Alternatively or additionally, the oscilloscope 10 or the pre-processing sub-circuit 26 may be configured to estimate the frequencies of the at least two carriers, e.g. by a Fast Fourier transform of the input signal(s).

For example, the filter units 38 may be established as finite-impulse-response (FIR) filters with programmable filter coefficients and/or as infinite-impulse-response (IIR) filters with programmable filter coefficients.

The down-converted signal components are down-sampled by the decimator units 40 (step S5). In other words, the decimator units 40 remove a certain portion of sample points associated with the down-converted signal components, respectively.

The down-sampled and down-converted signal components are forwarded to the acquisition memory 18 and to the trigger circuit 20.

The down-sampled and down-converted signal components are saved in the acquisition memory 18 (step S6). Due to the down-sampling of the signal components, the number of samples that have to be stored in the acquisition memory is reduced significantly, thus reducing the necessary memory size. The saved data may be post-processed in order to determine additional information with respect to the input signal(s) and/or the carriers.

Alternatively or additionally, the oscilloscope 10 may be configured to generate a graphic representation of the saved data, and the graphic representation may be displayed on the display 46.

The down-sampled and down-converted signal components are up-sampled by the at least one interpolator unit 42 (step S7). It is noted that the down-converted signal components may be directly forwarded to the trigger circuit 20, i.e. without prior down-sampling. The down-converted signal components may be up-sampled by the at least one interpolator unit 42 nevertheless. In other words, the at least one interpolator unit 42 enhances the sampling rate associated with the down-converted signal components, respectively, e.g. by an interpolation of the down-converted signal components. Thus, the down-converted signal components are sampled with a higher precision, such that the more information on the signal components is available.

The trigger circuit 20 or the at least one trigger unit 44 may then process the down-converted signal components independently and/or simultaneously (step S8). For example, the trigger circuit 20 or the at least one trigger unit 44 may apply certain trigger conditions to the signal components associated with the different carriers. The trigger conditions applied to the different signal components may be the same or may be different from each other. In some embodiments, the trigger circuit 20 or the at least one trigger unit 44 may detect certain events associated with the signal components and/or the different carriers.

Information regarding the input signals and/or the signal components of the multi-carrier signal may be displayed on the display 46 (step S9). The information displayed may comprise at least one of the following: IQ data associated with one or several of the signal components, a temporal course of one or several of the signal components, a temporal course of one or several input signals, information regarding trigger conditions met by one or several of the signal components, and/or information regarding trigger conditions not met by one or several of the signal components.

With the signal analysis method and the oscilloscope 10 described above, input signals having two or more carriers can be analyzed in real time, wherein signal components that are associated with the different carriers may be analyzed individually and in parallel. At the same time, the necessary memory size of the acquisition memory 18 is reduced, because the respective signal components are down-sampled prior to saving.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). For example, it should be understood that each block of the block diagrams and flowchart illustrations, and combinations of blocks in the block diagrams and/or flowchart illustrations, or portions thereof, could be implemented by special purpose hardware-based systems or circuits, etc., that perform the specified functions or operations, or combinations of special purpose hardware and embedded computer instructions.

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry one or more processors or portions thereof and accompanying software, firmware, hardware, and the like.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An oscilloscope, comprising:
   a signal input circuit configured to receive M input signals, wherein M is an integer greater than or equal to 1, wherein at least one of the input signals is a signal comprising at least two carriers;
   a switching matrix circuit comprising M switching matrix inputs and K switching matrix outputs, wherein K is an integer greater than or equal to 2, wherein each of the M switching matrix inputs is associated with one of the M input signals, respectively, wherein the switching matrix circuit is configured to selectively forward at least one input signal from at least one of the switching matrix inputs to the switching matrix outputs and to forward the signal comprising the at least two carriers to at least two switching matrix outputs, thereby obtaining at least two copies or representatives of the signal comprising the at least two carriers; and
   a downconverter circuit connected to the switching matrix outputs, the downconverter circuit comprising a local oscillator and at least two downconverter sub-circuits, wherein the local oscillator is configured to generate a local oscillator signal,
   wherein a first one of the at least two downconverter sub-circuits is configured to down-convert a first signal component of the signal comprising the at least two carriers based on the local oscillator signal, wherein the first signal component comprises a first one of the least two carriers, and
   wherein a second one of the at least two downconverter sub-circuits is configured to down-convert a second signal component of the signal comprising the at least two carriers based on the local oscillator signal, wherein the second signal component comprises a second one of the least two carriers.

2. The oscilloscope according to claim 1, wherein the local oscillator is a numerically controlled oscillator.

3. The oscilloscope according to claim 1, wherein the signal comprising the at least two carriers is established as a multi-carrier signal.

4. The oscilloscope according to claim 1, wherein the signal comprising the at least two carriers is an OFDM modulated signal or an FDMA modulated signal.

5. The oscilloscope according to claim 1, wherein the switching matrix circuit comprises a crossbar switch.

6. The oscilloscope according to claim 1, wherein the switching matrix circuit is configured to forward the signal to four switching matrix outputs or to eight switching matrix outputs.

7. The oscilloscope according to claim 1, wherein the at least two copies or representatives of the signal comprising the at least two carriers are forwarded to one of the at least two downconverter sub-circuits.

8. The oscilloscope according to claim 1, wherein each of the at least two downconverter sub-circuits comprises a filter unit, respectively, wherein the respective filter unit is configured to extract the first signal component or the second signal component.

9. The oscilloscope according to claim 1, wherein each of the at least two downconverter sub-circuits comprises a decimator unit, respectively, wherein the respective decimator unit is configured to down-sample the down-converted first signal component or the down-converted second signal component, respectively.

10. The oscilloscope according to claim 9, comprising an acquisition memory, wherein the acquisition memory is coupled to the decimator units downstream of the decimator units.

11. The oscilloscope according to claim 1, further comprising a trigger circuit, wherein the trigger circuit is connected to the at least two downconverter sub-circuits.

12. The oscilloscope according to claim 11, wherein the trigger circuit comprises at least one interpolator unit, and wherein the at least one interpolator unit is configured to up-sample the down-converted first signal component and/or the down-converted second signal component.

13. The oscilloscope according to claim 11, wherein the trigger circuit is configured to detect events associated with the down-converted first signal component and events associated with the down-converted second signal component simultaneously.

14. The oscilloscope according to claim 11, wherein the down-converted first signal component and the down-converted second signal component are an IQ signal, respectively.

15. The oscilloscope according to claim 1, further comprising a display, wherein the oscilloscope is configured to display information regarding the first signal component of the signal comprising the at least two carriers and/or information regarding the second signal component of the signal comprising the at least two carriers.

16. A signal analysis method of analyzing an input signal by an oscilloscope, the signal analysis method comprising the following steps:
    receiving at least one input signal, wherein the at least one input signal is a signal comprising at least two carriers;
    forwarding the at least one input signal comprising the at least two carriers from a switching matrix input to at least two switching matrix outputs;
    generating a local oscillator signal by a local oscillator;
    down-converting a first signal component of the signal comprising the at least two carriers based on the local oscillator signal, wherein the first signal component comprises a first one of the least two carriers; and
    down-converting a second signal component of the signal comprising the at least two carriers based on the local oscillator signal, wherein the second signal component comprises a second one of the least two carriers.

* * * * *